(12) United States Patent
Kim et al.

(10) Patent No.: US 7,268,623 B2
(45) Date of Patent: Sep. 11, 2007

(54) LOW VOLTAGE DIFFERENTIAL SIGNAL DRIVER CIRCUIT AND METHOD FOR CONTROLLING THE SAME

(75) Inventors: Kwi Dong Kim, Daejeon (KR); Chong Ki Kwon, Daejeon (KR); Jong Dae Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 7 days.

(21) Appl. No.: 11/292,673

(22) Filed: Dec. 2, 2005

(65) Prior Publication Data

US 2006/0125533 A1    Jun. 15, 2006

(30) Foreign Application Priority Data

Dec. 10, 2004   (KR) ...................... 10-2004-0104312
Jun. 17, 2005   (KR) ...................... 10-2005-0052149

(51) Int. Cl.
*H03F 3/45* (2006.01)

(52) U.S. Cl. ....................... 330/253; 330/258
(58) Field of Classification Search ..................... None
See application file for complete search history.

(56) References Cited

U.S. PATENT DOCUMENTS

| | | | | |
|---|---|---|---|---|
| 6,064,262 | A * | 5/2000 | Wang | 330/253 |
| 6,429,700 | B1 * | 8/2002 | Yang | 327/108 |
| 6,577,185 | B1 * | 6/2003 | Chandler et al. | 330/9 |
| 6,636,111 | B1 * | 10/2003 | Gross et al. | 327/589 |
| 6,788,116 | B1 | 9/2004 | Cook et al. | 327/108 |
| 6,791,369 | B1 * | 9/2004 | Hattori | 327/52 |
| 2003/0085737 | A1 | 5/2003 | Tinsley et al. | 326/86 |
| 2003/0122593 | A1 | 7/2003 | Volk | 327/108 |
| 2004/0041593 | A1 * | 3/2004 | Lai | 326/115 |

OTHER PUBLICATIONS

"LVDS I/O Interface for Gb/s-per-Pin Operation in 0.35μm CMOS," Andrea Boni et al, IEEE Journal of Solid-State Circuits, vol. 36, No. 4, Apr. 2001, pp. 706-711, © 2001 IEEE.

* cited by examiner

*Primary Examiner*—Cassandra Cox
(74) *Attorney, Agent, or Firm*—Ladas & Parry LLP

(57) ABSTRACT

Provided are a low voltage differential signal driver circuit and a method for controlling the same. The differential signal driver circuit includes: a differential amplification signal generator disposed between a power supply voltage terminal and a ground terminal, and outputting first and second differential amplification signals to first and second output terminals in response to first and second differential input signals, respectively; a common mode voltage generator for generating a common mode voltage in response to DC (direct current) offset voltages of the first and second differential amplification signals; and a variable load portion for controlling a resistance between the power supply voltage terminal and the first output terminal and a resistance between the power supply voltage terminal and the second output terminal in response to the common mode voltage such that the first and second differential amplification signals have constant DC offset voltages.

11 Claims, 3 Drawing Sheets

LOW VOLTAGE DIFFERENTIAL SIGNAL DRIVER CIRCUIT AND METHOD FOR CONTROLLING THE SAME

CROSS-REFERENCE TO RELATED APPLICATION

This application claims priority to and the benefit of Korean Patent Application Nos. 2004-104312, filed Dec. 10, 2004, and 2005-52149, filed Jun. 17, 2005, the disclosure of which is incorporated herein by reference in its entirety.

BACKGROUND

1. Field of the Invention

The present invention relates to a low voltage differential signal driver circuit and a method for controlling the same, and more particularly, to a low voltage differential signal driver circuit which outputs differential amplification signals having constant DC offset voltages and is capable of operating at a high speed at a low voltage, and a method for controlling the same.

2. Discussion of Related Art

In general, a low voltage differential signal driver circuit is being used to match information data between electronic devices at a high speed (for example, more than 200 MHz), in a high capacity information storage device, a high performance computer system, information telecommunication home appliances, a high-speed wire information telecommunication system, and so on.

FIG. 1 is a circuit diagram of a conventional low voltage differential signal driver circuit.

Referring to FIG. 1, the low voltage differential signal driver circuit includes a current source $I_S$ defining the magnitude of a driving current; current switches SW1 to SW4 for switching the flow of the driving current in response to a differential digital input signal; and a common-mode feedback block (CMFB) for sensing output matching impedance $R_O$ and DC offset voltages of differential output signals $V_{ON}$ and $V_{OP}$ to control the magnitude of a variable load $R_L$.

In the case where the low voltage differential signal driver circuit of FIG. 1 is manufactured using a complementary metal oxide semiconductor (CMOS) manufacturing process, the current source $I_S$ is comprised of an n-channel metal-oxide-semiconductor field effect transistor (nMOSFET) element, the current switches SW1 to SW4 are comprised of nMOSFET elements or pMOSFET elements, and the variable load $R_L$ is comprised of a p-channel metal-oxide-semiconductor field effect transistor (pMOSFET) element. As shown in FIG. 1, the conventional low voltage differential signal driver circuit having a general structure where four MOSFETs are series connected, has disadvantages in that the phase noise characteristics are bad due to unbalance of a switching gain and a switching noise that generates when the driving current is switched, and a power supply is low and a high speed operation is limited due to a four-stage series structure and a four-switch structure.

SUMMARY OF THE INVENTION

The present invention is directed to implementation of a low voltage differential signal driver circuit including: a differential amplification signal generator connected between a power supply voltage terminal and a ground terminal to output differential amplification signals; a common mode voltage generator for generating a common mode voltage in response to the differential amplification signals; and variable load elements connected between the power supply voltage terminal and output terminals of the differential amplification signal generator and varying in resistance in response to the common mode voltage, and a method for controlling the low voltage differential signal driver circuit, wherein a high speed operation can be performed at a low power supply voltage, and a signal noise characteristic and the magnitude of a differential output signal are stabilized against variations of a power supply voltage, an operating temperature, and a manufacturing process, thereby its application to an environment of a low voltage operation is facilitated.

One aspect of the present invention is to provide a differential signal driver circuit including: a differential amplification signal generator disposed between a power supply voltage terminal and a ground terminal, and outputting first and second differential amplification signals to first and second output terminals in response to first and second differential input signals, respectively; a common mode voltage generator for generating a common mode voltage in response to DC (direct current) offset voltages of the first and second differential amplification signals; and a variable load portion for controlling a resistance between the power supply voltage terminal and the first output terminal and a resistance between the power supply voltage terminal and the second output terminal in response to the common mode voltage such that the first and second differential amplification signals have constant DC offset voltages.

The differential amplification signal generator may include: a first MOSFET element connected between the power supply voltage terminal and the first output terminal, and having a connected to the second output terminal; a second MOSFET element connected between the power supply voltage terminal and the second output terminal, and having a gate connected to the first output terminal; a third MOSFET element connected between the first output terminal and a first node, and receiving the first differential input signal; a fourth MOSFET element connected between the second output terminal and the first node, and receiving the second differential input signal; a resistor connected between the first and second output terminals; and a current source connected between the first node and the ground terminal. The first and second MOSFET elements may be pMOSFET elements, and the third and fourth MOSFET elements may be nMOSFET elements.

Another aspect of the present invention is to provide a control method of a differential signal driver circuit, the method including the steps of: generating a common mode voltage in response to voltages of first and second differential amplification signals that are generated from a differential amplification signal generator disposed between a power supply voltage terminal and a ground terminal and outputting the first and second differential amplification signals to first and second output terminals in response to first and second differential input signals, respectively; and controlling a resistance between the power supply voltage terminal and the first output terminal and a resistance between the power supply voltage terminal and the second output terminal, in response to the common mode voltage, such that the first and second differential amplification signals have constant DC offset voltages.

The common mode voltage may have a voltage level corresponding to a difference between the DC offset voltages of the first and second differential amplification signals and a predetermined reference voltage.

The method may be operated in such a manner that when the DC offset voltage is greater than a predetermined value, the resistance between the power supply voltage terminal and the first output terminal and the resistance between the power supply voltage terminal and the second output terminal increase, and when the DC offset voltage is less than the predetermined value, the resistance between the power supply voltage terminal and the first output terminal and the resistance between the power supply voltage terminal and the second output terminal decrease.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF PREFERRED EMBODIMENTS

Figure 1:
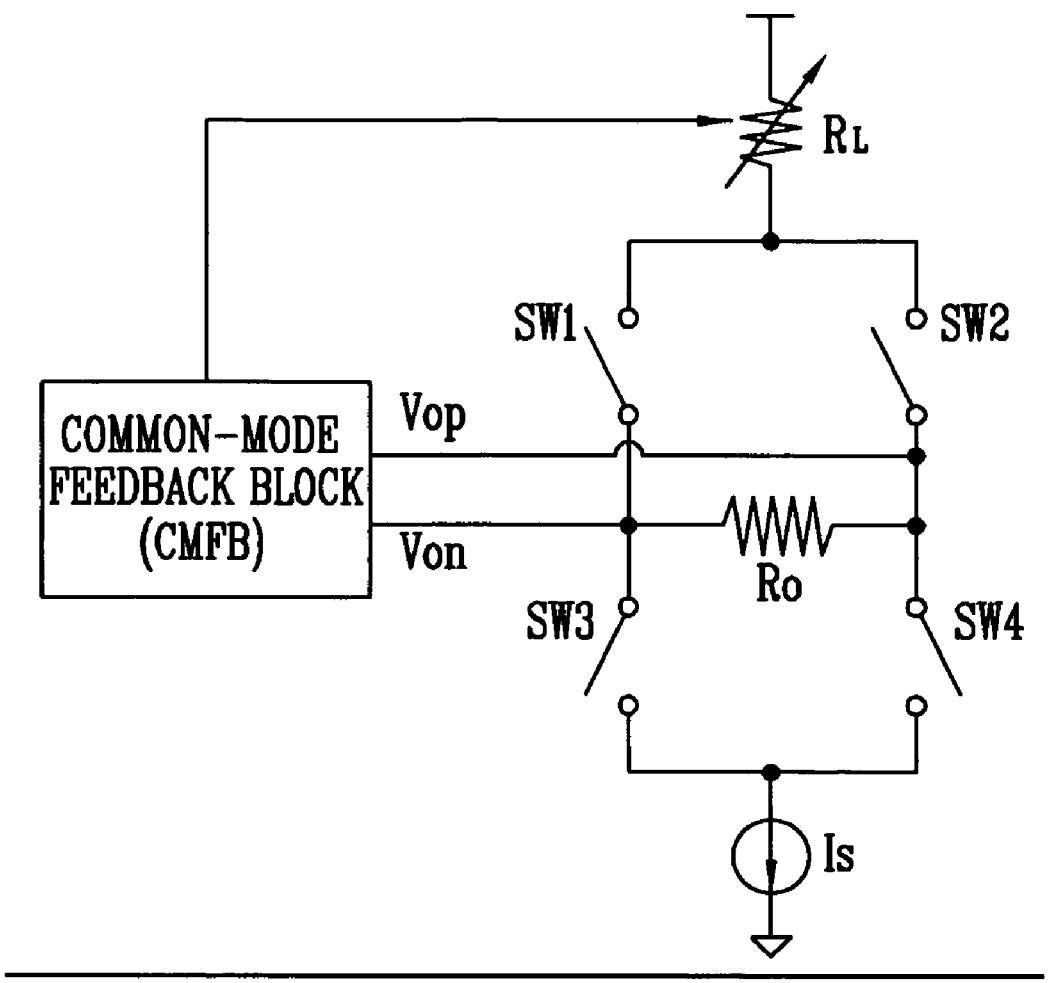
FIG. 1 is a circuit diagram of a conventional low voltage differential signal driver circuit.

Hereinafter, an exemplary embodiment of the present invention will be described in detail. However, the present invention is not limited to the embodiments disclosed below, but can be implemented in various types. Therefore, the present embodiment is provided for complete disclosure of the present invention and to fully inform the scope of the present invention to those ordinarily skilled in the art. In the following description, same drawing reference numerals are used for the same elements even in different drawings, and explanations of the same elements are omitted.

Figure 2:
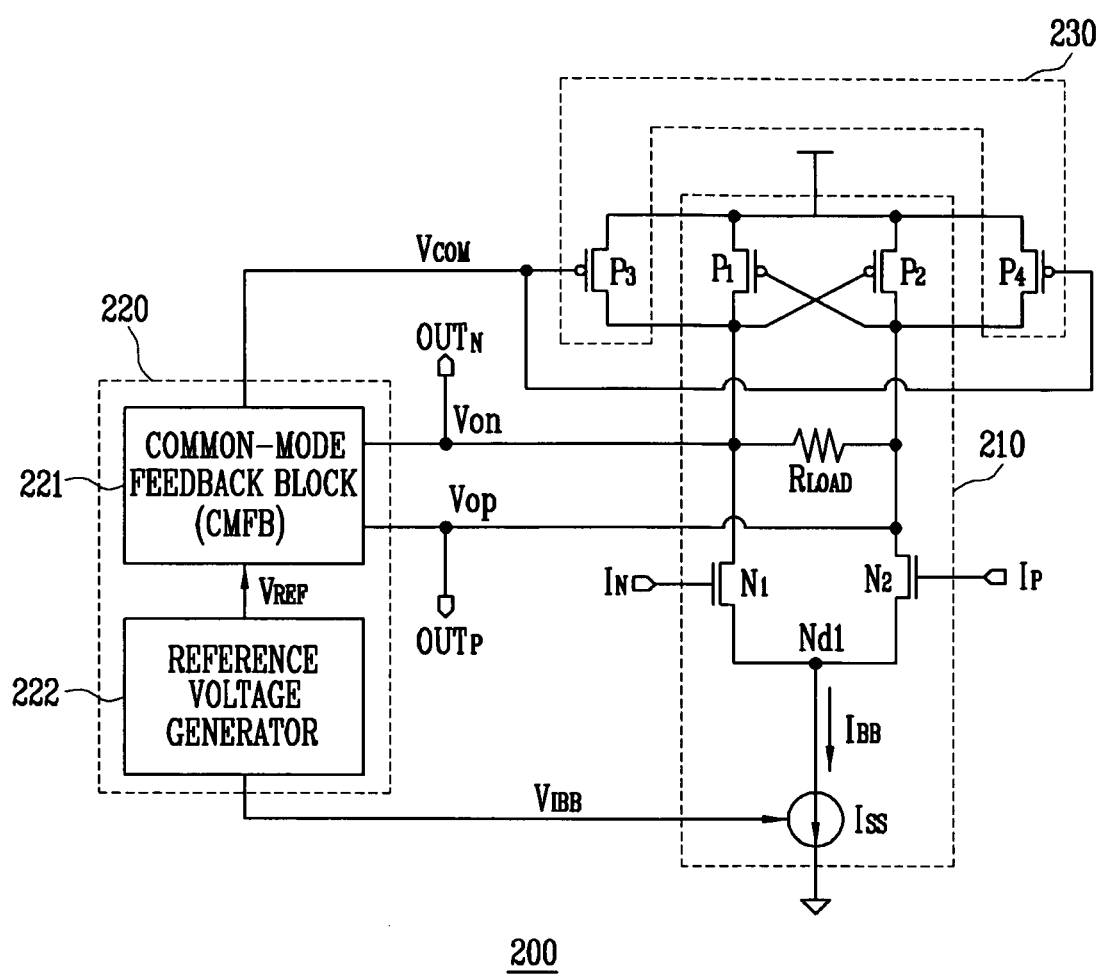
FIG. 2 is a circuit diagram of a low voltage differential signal driver circuit according to an exemplary embodiment of the present invention.

FIG. 2 is a circuit diagram of a low voltage differential signal driver circuit according to an exemplary embodiment of the present invention.

Referring to FIG. 2, the low voltage differential signal driver circuit according to an exemplary embodiment of the present invention includes a differential amplification signal generator 210, a common mode voltage generator 220, and a variable load portion 230.

The differential amplification signal generator 210 is installed between a power supply voltage terminal and a ground terminal, and outputs first and second differential amplification signals $V_{ON}$ and $V_{OP}$ to first and second output terminals $OUT_N$ and $OUT_P$ in response to first and second differential input signals $I_N$ and $I_P$, respectively.

The differential amplification signal generator 210 includes a first MOSFET element $P_1$ connected between the power supply voltage terminal and the first output terminal $OUT_N$, and having a gate connected to the second output terminal $OUT_P$; a second MOSFET element $P_2$ connected between the power supply voltage terminal and the second output terminal $OUT_P$, and having a gate connected to the first output terminal $OUT_N$; a third MOSFET element $N_1$ connected between the first output terminal $OUT_N$ and a first node Nd1 and receiving the first differential input signal $I_N$; a fourth MOSFET element $N_2$ connected between the second output terminal $OUT_P$ and the first node Nd1 and receiving the second differential input signal $I_P$; a differential output resistor $R_{LOAD}$ connected between the first output terminal $OUT_N$ and the second output terminal $OUT_P$; and a current source $I_{SS}$ connected between the first node Nd1 and the ground terminal.

The common mode voltage generator 220 generates a common mode voltage $V_{COM}$ in response to the first and second differential amplification signals $I_N$ and $I_P$. The common mode voltage generator 220 includes a reference voltage generator 222 for generating first and second reference voltages $V_{REF}$ and $V_{IBB}$ each having a stable value against variations of an operating temperature, a power supply voltage, and a manufacturing process; and a common-mode feedback block 221 for generating the common mode voltage $V_{COM}$ in response to the first reference voltage $V_{REF}$ and the first and second differential amplification signals $V_{ON}$ and $V_{OP}$.

The variable load portion 230 controls a resistance between the power supply voltage terminal and the first output terminal and a resistance between the power supply voltage terminal and the second output terminal, in response to the common mode voltage such that the first and second differential amplification signals have constant direct current (DC) offset voltages. The variable load portion 230 includes a first variable load element $P_3$ and a second variable load element $P_4$. The first variable load element $P_3$ is connected between the power supply voltage terminal and the first output terminal $OUT_N$ of the differential amplification signal generator 210, and changes in resistance in response to the common mode voltage $V_{COM}$. The second variable load element $P_4$ is connected between the power supply voltage terminal and the second output terminal $OUT_P$ of the differential amplification signal generator 210, and changes in resistance in response to the common mode voltage $V_{COM}$.

By the common mode voltage generated in response to the fist and second differential amplification signals, the fist and second variable load elements change in resistance, thereby enabling the first and second differential amplification signals to have the constant DC offset voltages.

The construction and operation of each constituent element will be described in more detail below.

First, the differential amplification signal generator 210 outputs the first and second differential amplification signals $V_{ON}$ and $V_{OP}$ in response to the first and second differential input signals $I_N$ and $I_P$, respectively.

In the differential amplification signal generator 210, the first and second MOSFET elements $P_1$ and $P_2$ function as positive feedback pMOSFET latch stages for positively feeding back the first and second differential amplification signals $V_{ON}$ and $V_{OP}$ to each other. The first and second MOSFET elements $P_1$ and $P_2$ can be realized using pMOSFET elements. The first and second MOSFET elements $P_1$ and $P_2$ receive a power supply voltage through their sources and substrates (bulks). The positive feedback pMOSFET latch parts $P_1$ and $P_2$ serve to remove phase offsets of the first and second differential amplification signals $V_{ON}$ and $V_{OP}$, increase a differential output gain, and suppress a phase noise of a differential output signal.

The third and fourth MOSFET elements $N_1$ and $N_2$ function as current path switching parts for switching a current path in response to the first and second differential input signals $I_N$ and $I_P$. The third and fourth MOSFET elements $N_1$ and $N_2$ can be realized using nMOSFET elements.

The current path switching parts $N_1$ and $N_2$ switch an output driving current $I_{BB}$ in response to the first and second differential input signals $I_N$ and $I_P$, through the differential output resistor $R_{LOAD}$ connected between the first and second output terminals $OUT_N$ and $OUT_P$. In another structural feature of the current path switching parts N1 and N2, the single nMOSFET element N1 or N2 is used as a current switching, and sources of the nMOSFET elements N1 and N2 are commonly connected to the current source $I_{SS}$, thereby facilitating a high speed operation resulting from minimization of the input capacitive load, and minimization of the switching noise.

The reference voltage generator 222 of the common mode voltage generator 220 generates the first and second reference voltages $V_{REF}$ and $V_{IBB}$ having stable values against the variations of a power supply voltage, an operating temperature, and a manufacturing process. The common-mode feedback block 221 generates the common mode voltage $V_{COM}$ in response to the first and second differential amplification signals $I_N$ and $I_P$. At this time, the common-mode feedback block 221 uses the first reference voltage $V_{REF}$ to generate the common mode voltage $V_{COM}$, and thus the common mode voltage $V_{COM}$ is also stable against the variations of a power supply voltage, an operating temperature, and a manufacturing process. In more detail, when the DC offset voltages of the first and second differential amplification signals $V_{ON}$ and $V_{OP}$ are greater than the reference voltage $V_{REF}$, the common-mode feedback block 221 increases the common mode voltage $V_{COM}$. Accordingly, the first and second variable load elements $P_3$ and $P_4$ increase in resistance, thereby decreasing the DC offset voltages of the first and second differential amplification signals $V_{ON}$ and $V_{OP}$. When the DC offset voltages of the first and second differential amplification signals $V_{ON}$ and $V_{OP}$ are less than the reference voltage $V_{REF}$, the common-mode feedback block 221 decreases the common mode voltage $V_{COM}$. Accordingly, the first and second variable load elements $P_3$ and $P_4$ decrease in resistance, thereby increasing the DC offset voltages of the first and second differential amplification signals $V_{ON}$ and $V_{OP}$. The common-mode feedback block 221 operates in the above manner, thereby maintaining the DC offset voltages of the first and second differential amplification signals $V_{ON}$ and $V_{OP}$ at a predetermined voltage level.

Meanwhile, a second reference voltage $V_{BB}$ is applied to the current source $I_{SS}$ such that the current source $I_{SS}$ of the differential amplification signal generator 210 can output a stable current against the variations of an operating temperature, a power supply voltage, and a manufacturing process. Accordingly, the current source $I_{SS}$ can supply a stable output driving current $I_{BB}$ irrespective of the variations of an operating temperature, a power supply voltage, and a manufacturing process, thereby providing the magnitude of the stable differential output signal.

The common mode voltage $V_{COM}$ is applied to the first and second variable load elements $P_3$ and $P_4$ each connected between the power supply voltage terminal and the first and second output terminals $OUT_N$ and $OUT_P$ of the differential amplification signal generator 210. In a more detail description, the first and second variable load elements $P_3$ and $P_4$ receive the common mode voltage $V_{COM}$ at their gates and receive the power supply voltage at their sources and substrates (bulks), and have drains connected to the first and second output terminals $OUT_N$ and $OUT_P$. As the first and second variable load elements $P_3$ and $P_4$ are connected in the structure, the common mode voltage $V_{COM}$ causes a variation of channel resistance while constantly maintaining the magnitudes of the DC offset voltages of the first and second differential amplification signals $V_{ON}$ and $V_{OP}$. At this time, the common mode voltage $V_{COM}$ has a stable value against the variations of a power supply voltage, an operating temperature, and a manufacturing process, and therefore the magnitudes of the DC offset voltages of the first and second differential amplification signals $V_{ON}$ and $V_{OP}$ also have the stable values against their variations.

In the above-constructed low voltage differential signal driver circuit 200, the first and second variable load elements $P_3$ and $P_4$ and the positive feedback pMOSFET latch parts P1 and P2 are connected in parallel between the power supply voltage terminal and the output terminals $OUT_N$ and $OUT_P$. Therefore, the first and second variable load elements $P_3$ and $P_4$, the positive feedback pMOSFET latch parts P1 and P2, the current path switching parts N1 and N2, and the current source $I_{SS}$ are connected to form a series 3-stage structure between the power supply voltage terminal and the ground terminal, thereby facilitating operation at a low power supply voltage.

Figure 3:
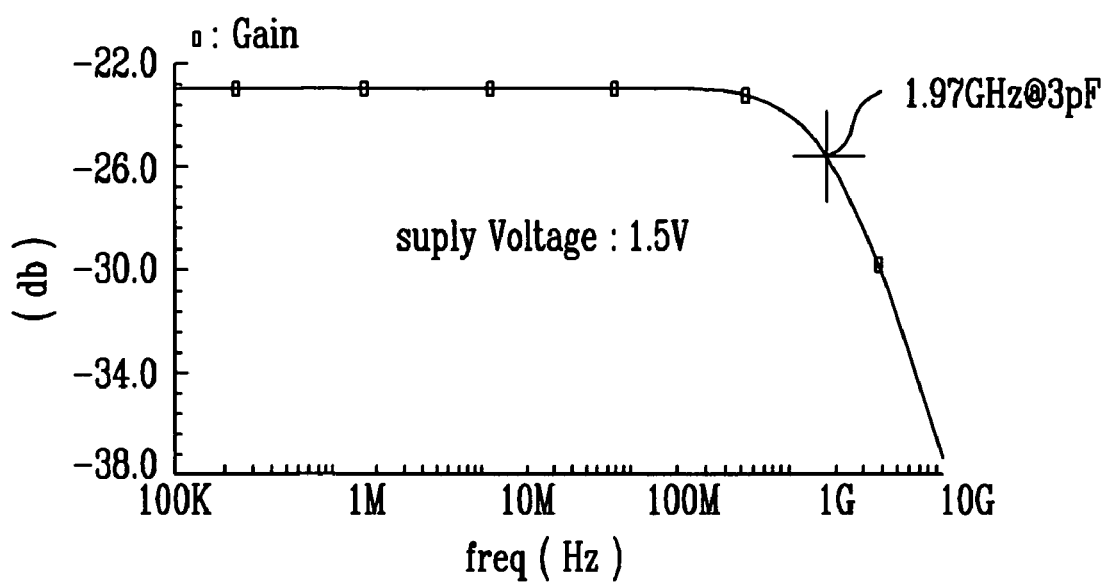
FIG. 3 is a graph showing a frequency response characteristic in the low voltage differential signal driver circuit of FIG. 2.

FIG. 3 is a graph showing a frequency response characteristic in the low voltage differential signal driver circuit of FIG. 2. In FIG. 3, an abscissa axis represents an operating frequency of the differential input signal, and an ordinate axis represents a frequency gain of the differential output signal. The operating voltage is set to 1.5 volts, the differential output resistor $R_{LOAD}$ is set to 100Ω, and loads of the output terminals $V_{ON}$ and $V_{OP}$ are set to 3 pF.

Referring to FIG. 3, in the low voltage differential signal driver circuit according to the present invention, the differential input signal has an operating frequency of 1.97 GHz when a frequency gain of the differential output signal is lowered by 3 dB. This means that the high-speed operation of several GHz can be performed even at the low supply voltage. In the low voltage differential signal driver circuit according to the present invention, the constant DC offset voltage (for example, 1.2V to 1.3V) and the magnitude of the differential signal (for example, 300 mV to 400 mV) can be output stably.

As described above, in the low voltage differential signal driver circuit and method for controlling the same according to the present invention, the high speed operation can be performed at the low power supply voltage, and the characteristic of the signal noise and the magnitude of the differential output signal are stabilized against variations of a power supply voltage, an operating temperature, and a manufacturing process, and its application to an environment of a low voltage operation is facilitated.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A differential signal driver circuit comprising:
   a differential amplification signal generator disposed between a power supply voltage terminal and a ground terminal, and outputting first and second differential amplification signals to first and second output terminals in response to first and second differential input signals, respectively;
   a common mode voltage generator for generating a common mode voltage in response to DC (direct current) offset voltages of the first and second differential amplification signals, wherein the common mode voltage has a voltage level corresponding to a difference between the DC offset voltages of the first and second differential amplification signals and a predetermined reference voltage; and a variable load portion for controlling a resistance between the power supply voltage terminal and the first output terminal and a resistance between the power supply voltage terminal and the second output terminal in response to the common mode voltage such that the first and second differential amplification signals have constant DC offset voltages.

2. The circuit according to claim 1, whereIn the resistance between the power supply voltage terminal and the first output terminal and the resistance between the power supply voltage terminal and the second output terminal increase when the DC offset voltage is greater than a predetermined value, and the resistance between the power supply voltage terminal and the first output terminal and the resistance between the power supply voltage terminal and the second output terminal decrease when the DC offset voltage is less than the predetermined value.

3. The circuit according to claim 1 or 2, wherein the common mode voltage generator comprises:
   a reference voltage generator for generating a constant reference voltage; and
   a common-mode feedback block for generating the common mode voltage in response to the first and second differential amplification signals.

4. The circuit according to claim 1 or 2, wherein the differential amplification signal generator comprises:
   a first MOSFET (metal-oxide-semiconductor field effect transistor) element connected between the power supply voltage terminal and the first output terminal, and having a gate connected to the second output terminal;
   a second MOSFET element connected between the power supply voltage terminal and the second output terminal, and having a gate connected to the first output terminal;
   a third MOSFET element connected between the first output terminal and a first node, and receiving the first differential input signal;
   a fourth MOSFET element connected between the second output terminal and the first node, and receiving the second differential input signal;
   a resistor connected between the first and second output terminals; and
   a current source connected between the first node and the ground terminal.

5. The circuit according to claim 4, wherein the first and second MOSFET elements are pMOSFET (p-channel metal-oxide-semiconductor field effect transistor) elements, and the third and fourth MOSFET elements are nMOSFET (n-channel metal-oxide-semiconductor field effect transistor) elements.

6. The circuit according to claim 4, wherein the common mode voltage generator comprises:
   a reference voltage generator for generating a first reference voltage; and
   a common-mode feedback block for generating the common mode voltage In response to the reference voltage and the first and second differential amplification signals.

7. The circuit according to any one of claims 1 to 2, wherein the variable load portion comprises:
   a first variable load element connected between the power supply voltage terminal and the first output terminal, and varying in resistance in response to the common mode voltage; and
   a second variable load element connected between the power supply voltage terminal and the second output terminal, and varying in resistance in response to the common mode voltage.

8. The circuit according to claim 7, wherein the first variable load element is a fifth MOSFET element connected between the power supply voltage terminal and the first output terminal and receiving the common mode voltage at its gate, and
   the second variable load element is a sixth MOSFET element connected between the power supply voltage terminal and the second output terminal and receiving the common mode voltage at its gate.

9. The circuit according to claim 8, wherein the fifth and sixth MOSFET elements are pMOSFET elements.

10. A method for controlling a differential signal driver circuit, the method comprising the steps of:
    generating a common mode voltage in response to voltages of first and second differential amplification signals that are generated from a differential amplification signal generator disposed between a power supply voltage terminal and a ground terminal and outputting the first and second differential amplification signals to first and second output terminals in response to first and second differential input signals, respectively, wherein the common mode voltage has a voltage level corresponding to a difference between the DC offset voltages of the first and second differential amplification signals and a predetermined reference voltage; and
    controlling a resistance between the power supply voltage terminal and the first output terminal and a resistance between the power supply voltage terminal and the second output terminal, in response to the common mode voltage, such that the first and second differential amplification signals have constant DC offset voltages.

11. The method according to claim 10, wherein, the resistance between the power supply voltage terminal and the first output terminal and the resistance between the power supply voltage terminal and the second output terminal increase when the DC offset voltage is greater than a predetermined value, and the resistance between the power supply voltage terminal and the first output terminal and the resistance between the power supply voltage terminal and the second output terminal decrease when the DC offset voltage Is less than the predetermined value.

* * * * *